United States Patent
Lee et al.

(10) Patent No.: US 8,802,464 B2
(45) Date of Patent: Aug. 12, 2014

(54) METHOD OF FORMING PROCESS SUBSTRATE USING THIN GLASS SUBSTRATE AND METHOD OF FABRICATING FLAT DISPLAY DEVICE USING THE SAME

(75) Inventors: Jae-Won Lee, Gyeonggi-Do (KR); Ki-Yong Kim, Gyeonggi-Do (KR); Jae Young Oh, Gyeonggi-Do (KR); Yong-Su An, Gyeonggi-Do (KR); Sung-Ki Kim, Gyeonggi-Do (KR); Gi-Sang Hong, Gyeonggi-Do (KR); Jin-Bok Lee, Gyeonggi-Do (KR); Sang-Hyuk Won, Gyeonggi-Do (KR); Dong-Kyu Lee, Jeollabuk-Do (KR)

(73) Assignee: LG Display Co., Ltd., Seoul (KR)

( * ) Notice: Subject to any disclaimer, the term of this patent is extended or adjusted under 35 U.S.C. 154(b) by 23 days.

(21) Appl. No.: 13/459,781

(22) Filed: Apr. 30, 2012

(65) Prior Publication Data
US 2013/0023075 A1   Jan. 24, 2013

(30) Foreign Application Priority Data

Jul. 21, 2011 (KR) .................. 10-2011-0072680
Jan. 20, 2012 (KR) .................. 10-2012-0006983

(51) Int. Cl.
*H01L 21/58* (2006.01)

(52) U.S. Cl.
USPC .............. 438/28; 257/E21.598; 257/E33.071; 345/84

(58) Field of Classification Search
CPC .............. H01L 51/0096; G02F 2001/133302
USPC .............. 438/28, 38; 257/E33.071, E21.598; 345/84; 156/391, 381
See application file for complete search history.

(56) References Cited

U.S. PATENT DOCUMENTS

| 4,883,561 A * | 11/1989 | Gmitter et al. ................... 438/27 |
| 2006/0027318 A1* | 2/2006 | Hashizume et al. ........... 156/285 |
| 2009/0040411 A1* | 2/2009 | Kawamura et al. ............. 349/46 |
| 2009/0321005 A1* | 12/2009 | Higuchi et al. ................ 156/249 |
| 2011/0092004 A1* | 4/2011 | Kim et al. ........................ 438/28 |
| 2012/0202010 A1* | 8/2012 | Uchida ......................... 428/157 |

FOREIGN PATENT DOCUMENTS

| JP | 2005209756 A | 8/2005 |
| JP | 2007212572 A | 8/2007 |
| WO | 2011/048979 A1 | 4/2011 |

OTHER PUBLICATIONS

Office Action dated Nov. 19, 2013 from the Japanese Intellectual Property Office in counterpart Japanese application No. 2012-162595.

* cited by examiner

*Primary Examiner* — Caridad Everhart
(74) *Attorney, Agent, or Firm* — Morgan, Lewis & Bockius LLP

(57) ABSTRACT

A method for fabricating a process substrate includes: providing a first substrate; providing a substrate and an auxiliary substrate; contacting the substrate and the auxiliary substrate with each other in a vacuum state, thereby forming micro spaces of a vacuum state between the substrate and the auxiliary substrate; and increasing a pressure at the outside of the contacted substrate and auxiliary substrate to attach the substrate and the auxiliary substrate to each other by a pressure difference between the micro spaces and the outside of the contacted substrate and auxiliary substrate.

12 Claims, 10 Drawing Sheets

METHOD OF FORMING PROCESS SUBSTRATE USING THIN GLASS SUBSTRATE AND METHOD OF FABRICATING FLAT DISPLAY DEVICE USING THE SAME

CROSS-REFERENCE TO RELATED APPLICATION

Pursuant to 35 U.S.C. §119(a), this application claims the benefit of earlier filing date and right of priority to Korean Applications No. 10-2011-0072680 and 10-2012-0006983 filed on Jul. 21, 2011 and Jan. 20, 2012 the contents of which is incorporated by reference herein in its entirety.

BACKGROUND OF THE INVENTION

1. Field of the Invention

The present disclosure relates to a method of forming a process substrate using a thin glass substrate, and a method of fabricating a liquid crystal display (LCD) device using the same.

2. Background of the Invention

As all types of portable electronic devices such as a mobile phone, a PDA and a notebook computer develop, demands for a light, thin, short and small flat panel display (FDD) device increase. The FDD device includes an LCD (Liquid Crystal Display), a PDP (Plasma Display Panel), an FED (Field Emission Display), a VFD (Vacuum Fluorescent Display), etc. Among such FDD devices, the LCD device is being spotlighted due to massive production, easy driving, high picture quality and a large area.

The LCD device is mainly applied to a portable electronic device. In order to enhance portability of the electronic device, the size and weight of the LCD device should be reduced. Moreover, since an LCD device of a large area is recently fabricated, demands for a light and thin configuration increase more.

The size or the weight of the LCD device can be reduced in various manners. However, it is limited to reduce the number of main components of the LCD device. Moreover, it is difficult to reduce the entire size or weight of the LCD device by reducing the weights of the main components, since the weights of the main components are small.

SUMMARY OF THE INVENTION

Therefore, an aspect of the detailed description is to provide a method for fabricating a liquid crystal display (LCD) device capable of minimizing the entire weight of the LCD device and simplifying the fabrication processes, by using a light and thin glass substrate without performing an etching process with respect to the glass substrate.

Another aspect of the detailed description is to provide a method for fabricating a liquid crystal display (LCD) device capable of preventing the occurrence of foreign materials or air foam between a glass substrate and an auxiliary substrate, by attaching the glass substrate to the auxiliary substrate in a vacuum state.

To achieve these and other advantages and in accordance with the purpose of this specification, as embodied and broadly described herein, there is provided a method for fabricating a liquid crystal display device, the method comprising: providing a first substrate; forming a second process substrate by attaching a second substrate to a second auxiliary substrate in a vacuum state; forming a gate line, a data line, a thin film transistor and a pixel electrode on the first substrate; forming a color filter layer on the second substrate of the second process substrate; attaching the first substrate and the second process substrate to each other, thereby forming a liquid crystal panel; and separating the second auxiliary substrate from the liquid crystal panel.

The forming a second process substrate may include: contacting the second substrate and the second auxiliary substrate with each other in a vacuum state; and forming an atmospheric state at the out region of the contacted second substrate and second auxiliary substrate to press the contacted second substrate and second auxiliary substrate by the atmospheric pressure in order to attach the second substrate and the second auxiliary substrate.

To achieve these and other advantages and in accordance with the purpose of this specification, as embodied and broadly described herein, there is also provided a method for fabricating a process substrate, the method comprising: providing a substrate and an auxiliary substrate; contacting the substrate and the auxiliary substrate with each other in a vacuum state, thereby forming micro spaces of a vacuum state between the substrate and the auxiliary substrate; and increasing a pressure at the outside of the contacted substrate and auxiliary substrate to attach the substrate and the auxiliary substrate to each other by a pressure difference between the micro spaces and the outside of the contacted substrate and auxiliary substrate.

The process substrate fabricated according to the present invention may comprise: a substrate; an auxiliary substrate contacting the substrate; and micro spaces formed on an entire interfacial surface between the substrate and the auxiliary substrate, wherein pressure within of the micro spaces are lower than atmospheric pressure outside the substrate and the auxiliary substrate.

The substrate and the auxiliary substrate may be formed of glass, the substrate may have a thickness of 0.1 mm~0.4 mm, the auxiliary substrate may have a thickness of 0.3 mm or more than, and the substrate may have a roughness of 5.0 nm or less than.

The present invention may have the following advantages.

Firstly, a thin and light LCD device can be provided without requiring an additional panel etching process. This can prevent damages of the substrate due to weakened strength of the substrate, resulting from increased surface roughness of the liquid crystal panel by an etching process.

Secondly, since the glass substrate and the auxiliary substrate are attached to each other in a vacuum state, foreign materials or air foam can be prevented from being introduced into space between the glass substrate and the auxiliary substrate.

Thirdly, since the glass substrate and the auxiliary substrate are attached to each other by a uniform pressure, a wrap phenomenon can be prevented. The wrap phenomenon indicates the occurrence of bending of a substrate, resulting from a gap between corner regions or central regions of a glass substrate and an auxiliary substrate attached to each other.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
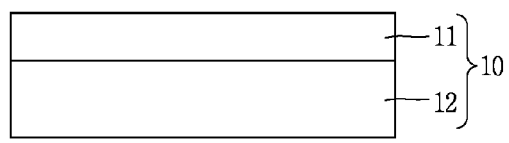
FIG. 1 is a view showing a structure of a process substrate according to the present invention.

Description will now be given in detail of the exemplary embodiments, with reference to the accompanying drawings. For the sake of brief description with reference to the drawings, the same or equivalent components will be provided with the same reference numbers, and description thereof will not be repeated.

There are many factors influencing on the weight of a liquid crystal display (LCD) device. Among such factors, a glass substrate is a largest influential factor due to its heavy weight. Therefore, reducing the weight of the glass substrate is most effective to reduce the entire weight of the LCD device.

The thickness of the glass substrate is a main factor to determine a viewing angle when implementing 3D images. That is, a black matrix and a film patterned retarder (FPR) are formed on two surfaces of a color filter substrate of the LCD device. When the glass substrate has a great thickness, a distance between the black matrix and the FPR is long. Therefore, an area of the black matrix should be increased so as to prevent 3D crosstalk. However, in the case of increasing the area of the black matrix, a viewing angle for viewing a 3D display device is narrowed and brightness is lowered.

In order to enhance quality of a 3D LCD device being actively researched, an LCD device should be fabricated by using a thin glass substrate.

Generally, the glass substrate is etched by an etching solution such as HF. More specifically, two substrates are attached to each other to fabricate an LC panel. Then, a hydrofluoric acid solution is sprayed on two surfaces of the LC panel by using a spray device, etc., resulting in etching an outer side surface of the two substrates. However, in this case, the etching is not performed on the entire region of the glass substrates at the same speed due to the characteristics of the glass substrates, resulting in increase of surface roughness of the glass substrate. The increase of surface roughness may cause polarizing plates to be attached onto two surfaces of the LC panel with a low bonding force.

Furthermore, the increased surface roughness causes the substrate to partially have a relatively small thickness. The part of a small thickness has low strength, which lowers the entire strength of the substrate. This may cause the substrate to have damages such as cracks due to an external impact. It takes several minutes to several tens of minutes to etch the glass substrate using an etching solution such as HF. This may lower productivity per unitary time.

In the present invention, an LCD device is fabricated not by etching the glass substrate, but by using a thin glass substrate provided from a glass substrate manufacturing company. Since a glass substrate additionally provided from a glass substrate manufacturing company is used, an etching process for reducing the thickness of the glass substrate is not required, and the glass substrate can have a smooth surface.

In the case of etching the glass substrate for a reduced thickness, surface roughness increases. However, in the present invention, a thin glass substrate provided from a glass substrate manufacturing company is used, resulting in implementing surface roughness (Ra) of 5.0 nm or less than.

In the present invention, an array substrate and a color filter substrate are fabricated by using glass substrates having a thickness of about 0.1 t-0.4 t. Then, the array substrate and the color filter substrate are attached to each other to complete an LCD device. The thin glass substrate has a minimized bending degree and no damages while moving. Here, 't' indicates 'mm', whereby 0.1 t means a thickness of 0.1 mm and 0.4 t means a thickness of 0.4 mm. Hereinafter, 'mm' is displayed as 't' for convenience of explanations.

The glass substrate having a thickness of about 0.1 t-0.4 t is greatly bent when being used to fabricate an LCD device, thereby having severe downward deformation. This may cause a problem in transferring the glass substrate using a transferring means such as a cassette. Furthermore, the glass substrate is drastically bent even by a small impact occurring during loading and unloading, thereby having frequent occurrences of positional errors. This may cause damages of the glass substrate due to collisions, thereby not allowing subsequent processing.

In the present invention, a thin glass substrate having a thickness of 0.1 t-0.4 t is attached to an auxiliary substrate before being introduced to a manufacturing line. This may allow the thin glass substrate to have a bending characteristic equal to or enhanced than that of the conventional glass substrate having a thickness of about 0.7 t. As a result, the thin glass substrate can be prevented from being downward deformed while being transferred or while undergoing unit processing. Here, the auxiliary substrate can be easily detached from the glass substrate having a thickness of 0.1 t-0.4 t, and can undergo subsequent processing at a temperature for fabricating a general LCD device. The auxiliary substrate is formed of material having an expansion ratio similar to that of the glass substrate. The auxiliary substrate has a thickness of 0.3 t (0.3 mm) or more than, preferably, a thickness of 0.3-1.0 t (0.3 mm~1 mm).

In the present invention, the thin glass substrate and the auxiliary substrate can be attached to each other without using an additional external force, such as an adhesion force by an adhesive layer. The thin glass substrate and the auxiliary substrate are made to contact each other in a vacuum state, and then the contacted two substrates are exposed to the atmospheric air. As a result, atmospheric pressure is applied to the thin glass substrate and the auxiliary substrate to attach the two substrates to each other. The thin glass substrate and the auxiliary substrate may be attached to each other by one of various forces. For instance, the various forces may include a bonding force between the two glass substrates, a surface tensile force, van der Waal's forces, and a vacuum pressure inside a micro spaces between the glass substrates.

Hereinafter, a method of fabricating an LCD device according to a preferred embodiment of the present invention will be explained in more details.

FIG. 1 is a view showing a structure of a process substrate 10 applied to fabricate an LCD device according to the present invention. As shown in FIG. 1, the process substrate 10 includes a glass substrate 11, that is the thin glass substrate, and an auxiliary substrate 12 attached to each other. If the glass substrate 11 is directly introduced to a manufacturing line for manufacturing a general LCD device, the thin glass substrate is bent. This may cause a problem in transferring the thin glass substrate using a transferring means such as a cassette. Furthermore, the thin glass substrate is drastically bent even by a small impact occurring during loading and unloading in unit processing equipment, thereby having frequent occurrences of positional errors. This may cause damages of the thin glass substrate due to collisions, thereby not allowing subsequent processing.

In the present invention, as shown in FIG. 1, the process substrate 10 comprised of the glass substrate 11 and the auxiliary substrate 12 is introduced into a manufacturing line, thereby preventing bending of the glass substrate 11. This can prevent damages of the glass substrate 11, and can allow smooth processing.

The glass substrate 11 and the auxiliary substrate 12 may be attached to each other in various manners. For instance, an adhesive may be applied onto the glass substrate 11 or the auxiliary substrate 12, and then pressure may be applied to attach the two substrates to each other by the adhesive.

However, in the case of using the adhesive, the entire processes are complicated due to an adhesive application process, an adhesive hardening process, etc. Furthermore, when the glass substrate 11 or the auxiliary substrate 12 is separated from the process substrate 10 after processing, the process substrate 10 may be contaminated due to the remaining adhesive. In this case, the remaining adhesive should be cleansed.

However, in the present invention, the glass substrate 11 and the auxiliary substrate 12 are attached to each other in a simple contacting manner in a vacuum state, not by using an additional adhering means such as an adhesive. This can simplify the entire fabrication processes and reduce the fabrication costs.

Hereinafter, a method for attaching the glass substrate 11 and the auxiliary substrate 12 will be explained in more details with reference to the attached drawings.

Figure 2:
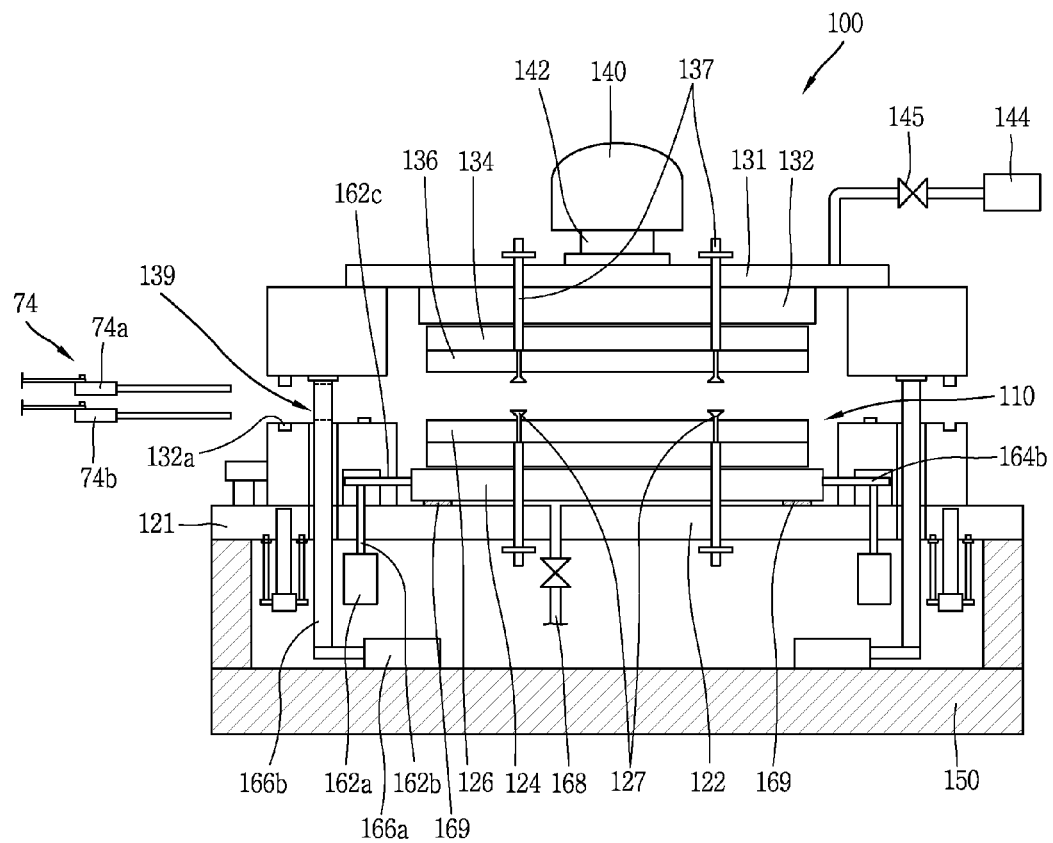
FIG. 2 is a view showing a vacuum attach device according to the present invention.

The glass substrate 11 and the auxiliary substrate 12 are attached to each other by a vacuum attach device shown in FIG. 2.

As shown in FIG. 2, the vacuum attach apparatus 100 includes a vacuum chamber 110, upper and lower plates 121 and 131 disposed in the vacuum chamber 110, and vacuum devices 140 and 144 for implementing a vacuum state inside the vacuum chamber 110.

The inside of the vacuum chamber 110 is in a vacuum state and an atmospheric pressure state, where the glass substrate 11 and the auxiliary substrate 12 having different pressures applied thereto are attached to each other by a pressure difference. An opening 139 through which the glass substrate 11 and the auxiliary substrate 12 are introduced into and discharge out of the vacuum chamber 110 is formed on one wall surface or two wall surfaces of the vacuum chamber 110.

Air inside the vacuum chamber 110 may be exhausted by the vacuum devices 140 and 144, and external air or other gases may be introduced into the vacuum chamber 110 through a vent pipe 168 for implementation of a vacuum state or an atmospheric state.

The vacuum devices 140 and 144 include a Turbo Molecular Pump (TMP) 140 and a dry pump 144. The dry pump 144 serves to firstly pump the vacuum pump 110 for implementation of low vacuum pressure, whereas the TMP 140 serves to secondly pump the vacuum pump 110 for implementation of high vacuum pressure. The reason why the vacuum chamber 110 is pumped twice by the TMP 140 and the dry pump 144 is as follows. Foreign materials inside the vacuum chamber 110 are removed by the first pumping so that the glass substrate 11 and the supplementary substrate 122 can be attached to each other without having foreign materials interposed therebetween. Then, the glass substrate 11 and the supplementary substrate 122 can be attached to each other through the second pumping.

In the drawings, the dry pump 144 or the TMP 140 is used for first vacuum and second vacuum. However, various vacuum pumps may be used for implementation of high and low vacuum pressures.

A lower base 122 is disposed above a lower plate 121. And, a first electrostatic chuck plate 124 and a first electrostatic chuck 126 are installed above the lower base 122, thereby fixing the glass substrate 11 introduced from the outside by an electrostatic force. An impact absorbing spring block 169 for attenuating external impacts may be formed at the lower base 122 and the lower plate 121.

An upper plate 131 is formed to face the lower plate 121, and an upper base 132 is installed on the upper plate 131. And, a second electrostatic chuck plate 134 and a second electrostatic chuck 136 are installed above the upper base 132, thereby fixing the auxiliary substrate 12 introduced from the outside by an electrostatic force.

A pair of first motors 162a are installed below the lower base 122. A rotation shaft 162b is connected to each first motor 162a, and is connected to a guide bar 162c installed on the side surface of the lower base 122. Once the rotation shaft 162b rotates upon driving of the first motors 162a, a rotation force of the rotation shaft 162b is converted into a linear motion of the guide bar 162c engaged with the rotation shaft 162b. As a result, the lower base 122 moves right and left. The movements of the lower base 122 right and left are implemented so that the glass substrate 11 and the auxiliary substrate 12 can be precisely attached to each other in an aligned state therebetween. The pair of first motors 162 allow the lower base 122 to minutely move in X and Y directions, thereby aligning the glass substrate 11 and the auxiliary substrate 12 with each other.

As the first motors 162a, various motors may be used. However, a linear motor for minutely controlling motion of the lower base 122 is preferably used since the first motors 162a serve to align the glass substrate 11 and the auxiliary substrate 12 with each other by moving the lower base 122. In the drawings, two first motors 162a are illustrated. However, at least three first motors 162a may be installed.

A second motor 166a is installed below the lower plate 121, and is connected to the upper plate 131 via a rotation shaft 166b. As the second motor 166a is driven, the rotation shaft 166b is extended or contracted, thereby lowering the upper plate 131 and the second electrostatic chuck plate 134 and the second electrostatic chuck 136 disposed above the upper plate 131. As a result, the glass substrate 11 and the auxiliary substrate 12 introduced into the first electrostatic chuck 126 and the second electrostatic chuck 136, respectively come in contact with each other. Here, a single second motor 166a may be installed, or a plurality of second motors 166a may be installed.

A plurality of first pins 127 are formed at the first electrostatic chuck plate 124 and the first electrostatic chuck 126. The first pins 127 serve to load the introduced glass substrate 11 thereon. Although not shown, accommodation holes for accommodating the first pins 127 are formed at the first electrostatic chuck plate 124 and the first electrostatic chuck 126. The first pins 127 are extended to the upside of the first electrostatic chuck 126 while up and down moving through the accommodation holes. Although not shown, the first pins 127 are communicated with an external vacuum pump (not shown) through outlets formed at central parts thereof, and suck the glass substrate 11 introduced through the outlets thus to fix the glass substrate 11 thereto.

Although not shown, a plurality of second pins 137 are formed at the second electrostatic chuck plate 134 and the second electrostatic chuck 136. The second pins 137 serve to load the introduced auxiliary substrate 12 thereon. Although not shown, accommodation holes for accommodating the second pins 137 are formed at the second electrostatic chuck plate 134 and the second electrostatic chuck 136. The second pins 137 are extended to the upside of the second electrostatic chuck 136 while up and down moving through the accommodation holes. Although not shown, the second pins 137 are communicated with an external vacuum pump (not shown) through outlets formed at central parts thereof, and suck the auxiliary substrate 12 introduced through the outlets thus to fix the auxiliary substrate 12 thereto.

The number of the first pins 127 and the second pins 137 may be variable according to the size of the glass substrate 11 and the auxiliary substrate 12 to be attached to each other, i.e., the size of the electrostatic chuck plates 124 and 134 and the electrostatic chucks 126 and 136.

Upon introduction of the glass substrate 11, the first pins 127 upward move to protrude towards the upper side of the first electrostatic chuck 126. Since air is exhausted out through the outlets of the first pins 127, the glass substrate 11 is sucked to the first pins 127. Once the first pins 127 having the glass substrate 11 sucked thereto downward move to be positioned below the first electrostatic chuck 126 through the accommodation holes, the glass substrate 11 is disposed on the first electrostatic chuck 126. At the same time, a direct current power is applied to the first electrostatic chuck 126 to generate static electricity, and the glass substrate 11 is fixed to the first electrostatic chuck 126 by the static electricity.

Upon introduction of the auxiliary substrate 12, the second pins 137 downward move to protrude toward the lower side of the second electrostatic chuck 136. Since air is exhausted out through the outlets of the second pins 137, the auxiliary substrate 12 is sucked to the second pins 137. Once the second pins 137 having the auxiliary substrate 12 sucked thereto upward move to be located above the second electrostatic chuck 136 through the accommodation holes, the auxiliary substrate 12 is disposed on the second electrostatic chuck 136. At the same time, a direct current power is applied to the second electrostatic chuck 136 to generate static electricity, and the auxiliary substrate 12 is fixed to the second electrostatic chuck 136 by the static electricity.

A loader unit 74 is disposed outside the vacuum chamber 110. The loader unit 74 serves to introduce or withdrawn the glass substrate 11 and the auxiliary substrate 12 into/from the vacuum chamber 110 therethrough. And, the loader unit 74 includes a first arm 74a for transferring the glass substrate 11, and a second arm 74b for transferring the auxiliary substrate 12.

Although not shown, a plurality of cameras may be installed in the vacuum chamber 110. The cameras serve to align the glass substrate 11 and the auxiliary substrate 12, and are implemented as CCD cameras.

A method for attaching the glass substrate 11 and the auxiliary substrate 12 to each other by the vacuum attach apparatus 100 will be explained with reference to FIGS. 3A to 3D.

Figure 3A:
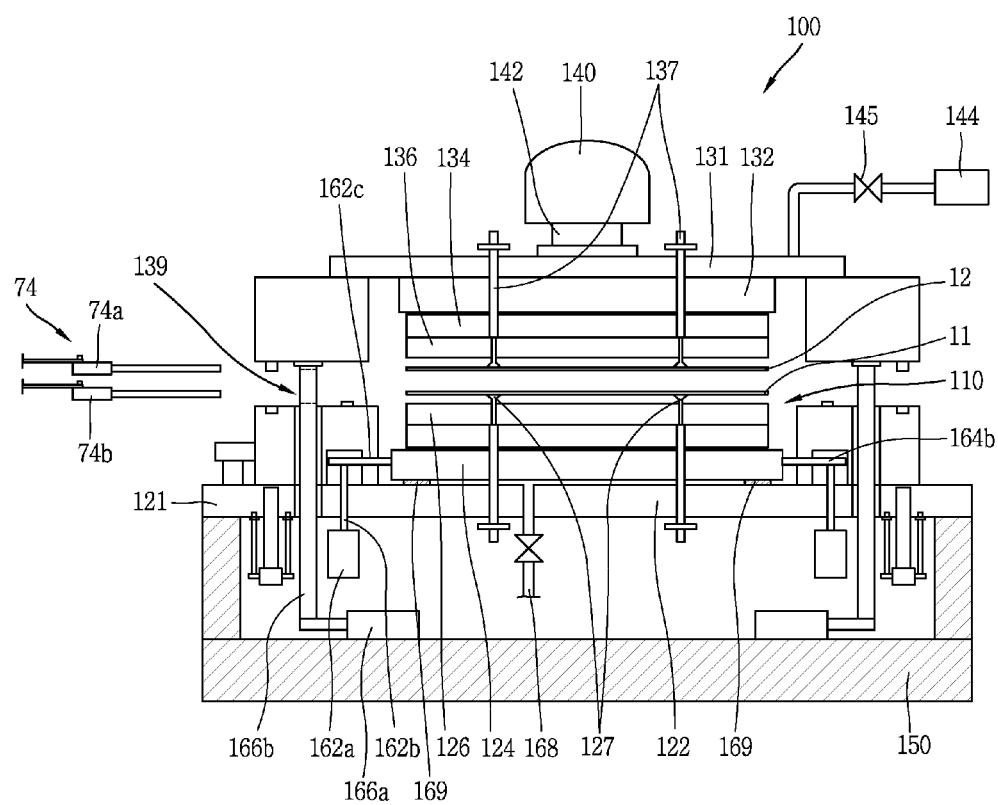
FIGS. 3A to 3E are views showing a method for attaching a substrate on an auxiliary substrate using a vacuum attach device.

As shown in FIG. 3A, once an opening 139 of the vacuum chamber 110 is open, the glass substrate 11 is introduced into the vacuum chamber 110 by the first arm 74a of the loader unit 74, and the auxiliary substrate 12 is introduced into the vacuum chamber 110 by the second arm 74b. Here, the glass substrate 11 is introduced into the vacuum chamber 110 in the original state, whereas the auxiliary substrate 12 is introduced into the vacuum chamber 110 in a reversed state after rotation of 180°. Alternatively, the auxiliary substrate 12 may be introduced in the original state, whereas the glass substrate 11 may be introduced in a reversed state after rotation of 180°.

The first pins 127 and the second pins 137 protrude from the first electrostatic chuck 126 and the second electrostatic chuck 136 while up and down moving from the first electrostatic chuck 126 and the second electrostatic chuck 136, respectively. As a vacuum pump (not shown) operates, the first pins 127 and the second pins 137 absorb the air through outlets. Accordingly, the glass substrate 11 and the auxiliary substrate 12 are absorbed to the first pins 127 and the second pins 137 by an absorbing force, respectively.

Figure 3B:
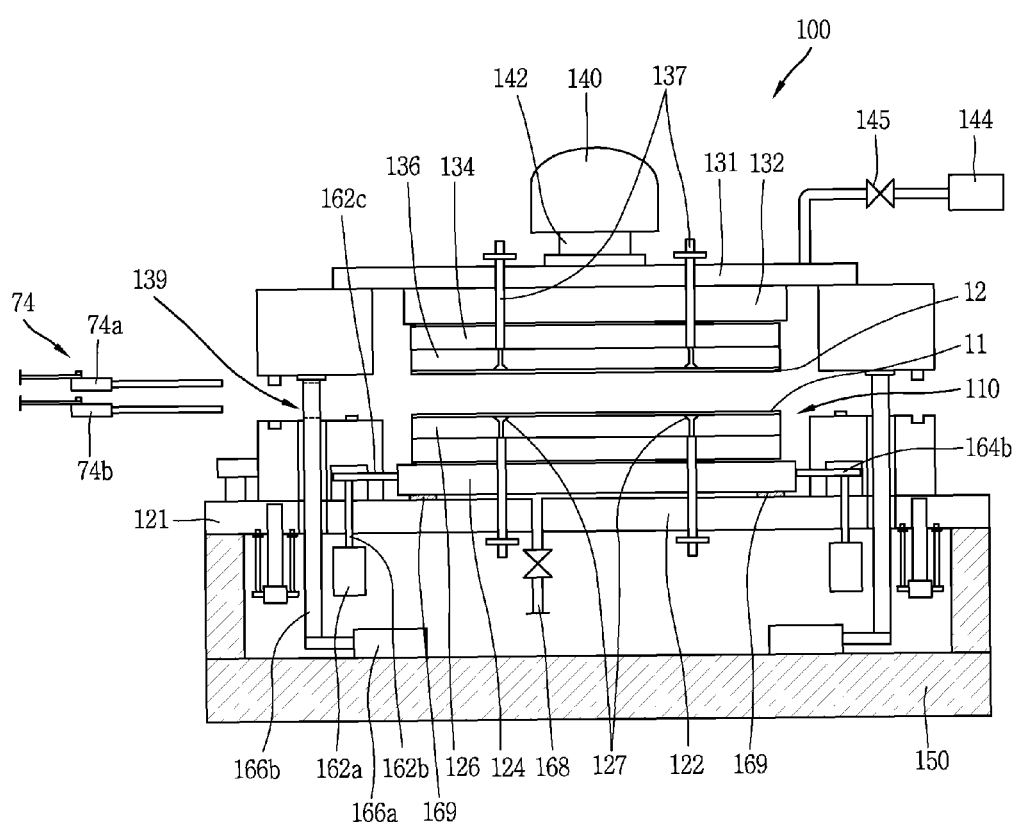

As shown in FIG. 3B, after the first arm 74a and the second arm 74b of the loader unit 74 are discharged out of the vacuum pump 110 through the opening 139, the opening 139 is closed. Then, the dry pump 144 operates to implement a first vacuum state inside the vacuum chamber 110.

In this state, the first pins 127 downward move and the second pins 137 upward move, and a direct current power is applied to the first electrostatic chuck 126 and the second electrostatic chuck 136. As a result, the glass substrate 11 and the auxiliary substrate 12 are fixed by the first electrostatic chuck 126 and the second electrostatic chuck 136 by an electrostatic force, respectively. Here, foreign materials introduced to space between the first electrostatic chuck 126 and the glass substrate 11, and between the second electrostatic chuck 136 and the auxiliary substrate 12 may be discharged out by an air pressure, by discharging air through the outlet of the second electrostatic chuck 136.

Figure 3C:
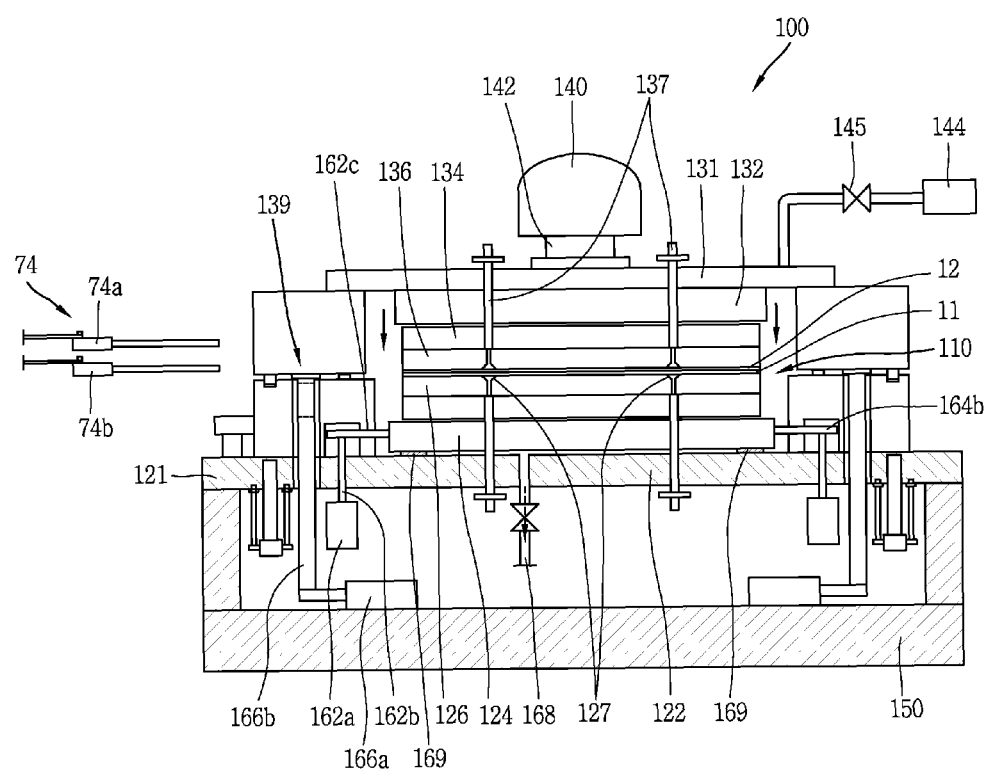

As shown in FIG. 3C, the glass substrate 11 and the auxiliary substrate 12 are aligned with each other, and then the TMP 140 operates to implement a high vacuum state inside the vacuum chamber 110. In this state, the upper plate 131 downward moves to cause the glass substrate 11 and the auxiliary substrate 12 to contact each other.

Figure 4:
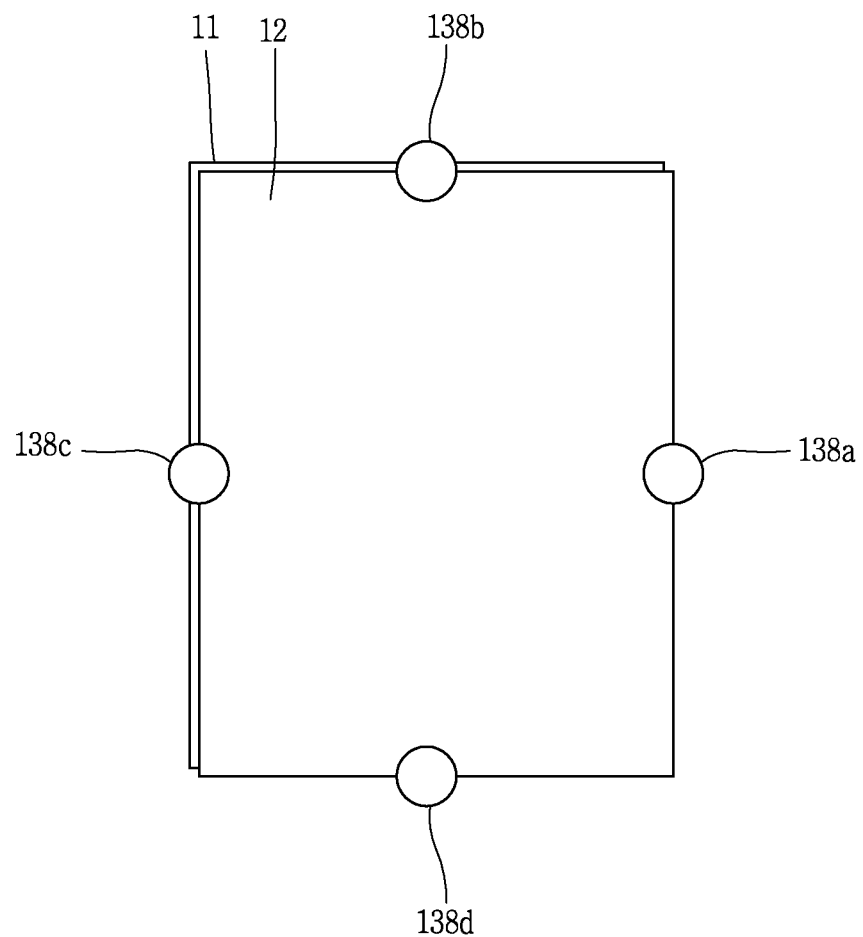
FIG. 4 is a views showing a method for aligning a substrate and an auxiliary substrate using a camera.

The glass substrate 11 and the auxiliary substrate 12 may be aligned with each other by a plurality of cameras (e.g., CCD cameras). More specifically, as shown in FIG. 4, four edges of the glass substrate 11 and the auxiliary substrate 12 aligned with each other are captured by a plurality of cameras 138a,138b,138c and 138d. Then, based on information on the captured image, an aligned state between the glass substrate 11 and the auxiliary substrate 12 is inspected. If the glass substrate 11 and the auxiliary substrate 12 have not been aligned with each other, the first motors 162a are driven to horizontally move the guide bar 162c connected to the rotation shaft 162b, resulting in aligning the glass substrate 11 and the auxiliary substrate 12 with each other. The cameras 138a,138b,138c and 138d are configured to real-time capture the glass substrate 11 and the auxiliary substrate 12 being aligned with each other, so as to check an aligned state therebetween. In the present invention, mis-align can be reduced to 100 μm or less through capturing of four edges.

The cameras may be installed at corner regions of the glass substrate 11 and the auxiliary substrate 12 to capture aligned state between the corners, thereby inspecting an aligned state of the glass substrate 11 and the auxiliary substrate 12.

Figure 3D:
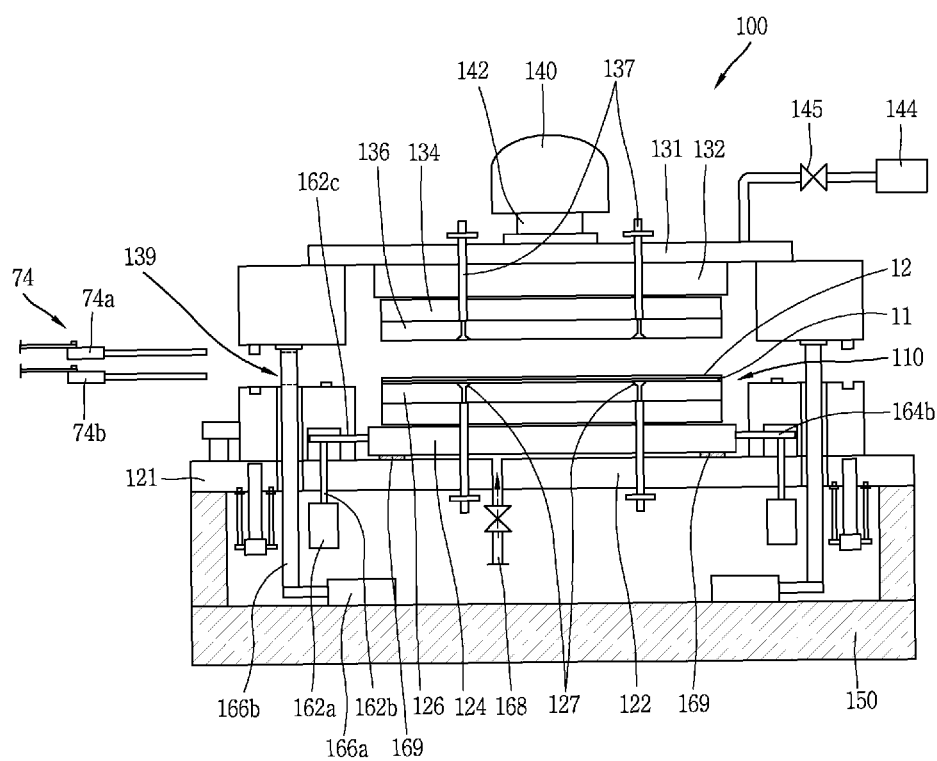

As shown in FIG. 3D, the direct current power applied to the second electrostatic chuck 136 is removed to remove an absorbing force of the second electrostatic chuck 136. In this state, the second motor 166a is driven to move the upper plate 131 to the upside, so that the auxiliary substrate 12 can maintain a contacted state with the glass substrate 11.

In this state, the vent pipe 168 is open to introduce air into the vacuum chamber 110 from the outside, thereby implementing an atmospheric pressure state inside the vacuum chamber 110. As a result, the atmospheric pressure is applied to the glass substrate 11 and the auxiliary substrate 12 contacting each other, so that the glass substrate 11 and the auxiliary substrate 12 are attached to each other.

Before opening the vent pipe 168, a primary pressurization may be performed. Once the glass substrate 11 and the auxiliary substrate 12 are completely sealed with each other by the primary pressurization, external air is prevented from being introduced into the space therebetween when the current air pressure is changed into atmospheric pressure.

Figure 3E:
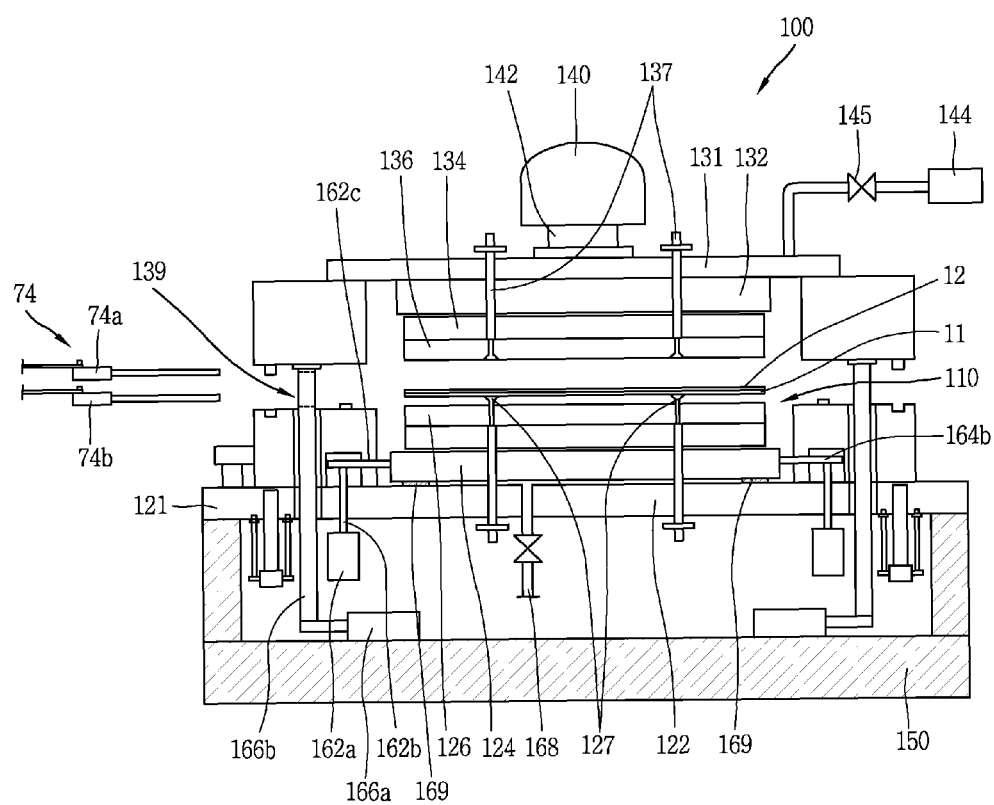

As shown in FIG. 3E, the opening 139 is open to discharge, by the first arm 74a of the loader unit 74, the glass substrate 11 and the auxiliary substrate 12 attached to each other. As a result, the process substrate 10 is completed.

Figure 5:
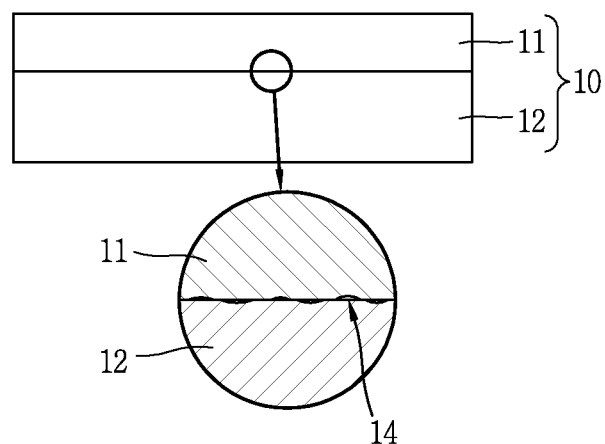
FIG. 5 is a partially enlarged sectional view of a process substrate fabricated by a vacuum attach device.

FIG. 5 is an enlarged view of part of the process substrate 10. Generally, a glass substrate provided from a glass substrate manufacturing company has roughness (Ra) of 0.5 nm or less than. Due to the roughness (Ra), micro spaces 14 is generated on an interfacial surface between the glass substrate 11 and the auxiliary substrate 12 when the glass substrate 11 and the auxiliary substrate 12 are attached to each other. The micro spaces are not regularly generated on the interfacial surface between the glass substrate 11 and the auxiliary substrate 12, but is generated on the entire region of the interfacial surface. Since the glass substrate 11 and the auxiliary substrate 12 are attached to each other in a vacuum attach device in a high vacuum state, the micro spaces 14 formed on the interfacial surface of the glass substrate 11 and the auxiliary substrate 12 maintains high vacuum pressure (P1). On the other hand, outside of the process substrate 10 (implemented as the glass substrate 11 and the auxiliary substrate 12 attached to each other) maintains atmospheric pressure (Patm). The glass substrate 11 and the auxiliary substrate 12 can maintain a completely attached state by a pressure difference between the high vacuum pressure (P1) inside the micro spaces 14 and the atmospheric pressure (Patm).

The glass substrate 11 and the auxiliary substrate 12 may be attached to each other by a surface tensile surface therebetween, or a van der Waal's force, etc. However, in the case that the glass substrate 11 and the auxiliary substrate 12 are attached to each other in a vacuum state like in the present invention, a pressure difference between the high vacuum pressure (P1) inside the micro spaces 14 and the atmospheric pressure (Patm) may be the most influential factor.

In the present invention, the glass substrate 11 and the auxiliary substrate 12 are attached to each other in a vacuum state, not by an additional adhering means such as an adhesive. This configuration may have the following advantages.

Firstly, since the thin glass substrate and the auxiliary substrate are attached to each other in a vacuum state, foreign materials or air foam are prevented from being introduced into the space between the thin glass substrate and the auxiliary substrate. This may prevent inferiority of the substrates due to the foreign materials. Furthermore, since the thin glass substrate and the auxiliary substrate are attached to each other by a uniform pressure, a wrap phenomenon may be prevented. This may prevent the occurrence of inferiority due to bending of the substrates, resulting from a gap between corner regions or central regions of the glass substrate and the auxiliary substrate attached to each other.

Secondly, since an adhering means such as an adhesive is not used in the present invention, no adhesive remains on the substrates. This may prevent contamination of the substrates, and require no process for removing any adhesive remaining on the substrates.

Thirdly, since an adhering means such as an adhesive is not used in the present invention, an adhesive application process is not required to simplify the fabrication processes.

The process substrate 10 may be formed by attaching the glass substrate 11 to a second auxiliary substrate, then by attaching the attached substrates to the first auxiliary substrate 12 in a vacuum attach apparatus, and then by separating the second auxiliary substrate from the attached substrates. The reason why the attaching processes are performed twice is as follows.

If the glass substrate 11 having a small thickness of about 0.1 t-0.4 t is fixed to the first electrostatic chuck 126 after being introduced into the vacuum attach apparatus, the glass substrate 11 may partially bent due to its small thickness. Such bending may cause the occurrence of air foam, and introduction of an etching liquid, etc. into the substrate 11 during a subsequent unit process. In order to solve such problems, the glass substrate 11 is attached to an additional auxiliary substrate, and the attached substrates are introduced into the vacuum attach device. Then, the attached substrates are attached to another surface of the auxiliary substrate 12, thereby preventing bending of the glass substrate 11 during vacuum attach processing. The glass substrate 11 may be attached to the additional auxiliary substrate in the vacuum attach device, or in the air by using static electricity or an adhesive. The reason is because foreign materials are not introduced into the second auxiliary substrate since the second auxiliary substrate is separated from the attached substrates upon completion of the process substrate 10

After the attached substrates of the glass substrate 11 and the second auxiliary substrate is attached to the first auxiliary substrate 12, the second auxiliary substrate is separated from the attached substrates thereby to complete the process substrate 10. An LCD device is fabricated by using the process substrate 10.

Hereinafter, a method for fabricating a thin LCD device using the process substrate prepared by the vacuum attach device will be explained in more details.

FIGS. 6A to 6G are views showing a method for fabricating an LCD device using the process substrate according to the present invention.

Figure 6A:
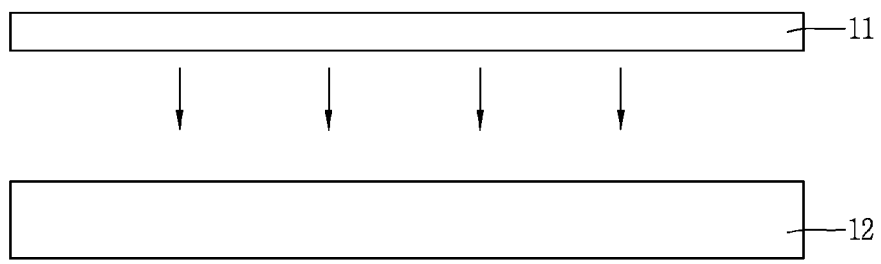
FIGS. 6A to 6E are views showing a method for fabricating an LCD device using a process substrate according to the present invention.

As shown in FIG. 6A, a first substrate 11 and a first auxiliary substrate 12 are attached to each other by using the vacuum attach device of FIG. 2, thereby implementing a first process substrate 10. Here, the first substrate 11 is formed of glass having a thickness of 0.1 t-0.4 t, and the first auxiliary substrate 12 is formed of the same glass having a thickness of 0.3 t or more than, preferably, 0.3 t-1.0 t. As the first substrate 11 and the first auxiliary substrate 12 are formed of the same material, the first substrate 11 and the first auxiliary substrate 12 have the same expansion ratio with respect to a temperature change. This may minimize errors due to different expansion ratios during subsequent processing, thereby preventing mis-align. Furthermore, a gate insulating layer, a semiconductor layer, a passivation layer, etc. can be prevented from being deposited on each other with a non-uniform thickness during chemical vapor deposition (CVD) of subsequent processing.

Figure 6B:
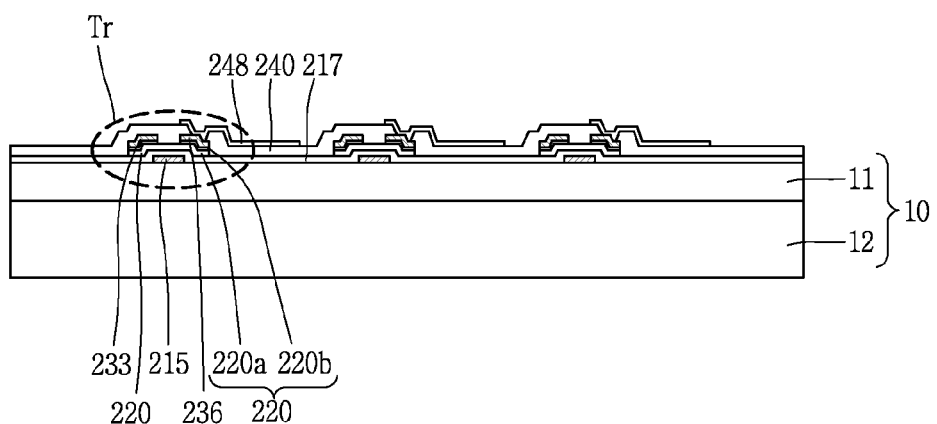

As shown in FIG. 6B, an array process is performed with respect to the first process substrate 10, thereby forming data lines (not shown) and gate lines (not shown) crossing each other on the first substrate 11 to define pixel regions. Here, the data lines and the gate lines cross each other in a state where a gate insulating layer 256 is interposed therebetween.

A switching device, a thin film transistor (Tr) is formed on each pixel region. The Tr includes a gate electrode 215, a gate insulating layer 217 formed on the gate electrode 215, a semiconductor layer 220 disposed on the gate insulating layer 217 and composed of an active layer 220 formed of pure amorphous silicon and an ohmic contact layer 220b formed of impure amorphous silicon, and a source electrode 233 and a drain electrode 236 formed on the semiconductor layer 220.

A passivation layer 240 for exposing the drain electrode 236 of the Tr is formed over the Tr, and a pixel electrode 248 formed of a transparent conductive material electrically contacting the drain electrode 236 is formed on the passivation layer 240.

Figure 6C:
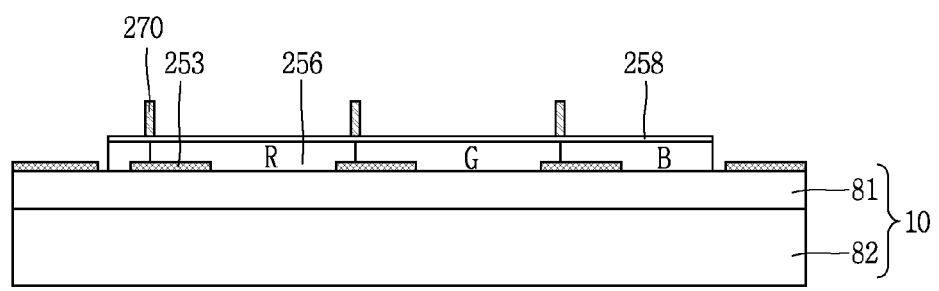

As shown in FIG. 6C, a second auxiliary substrate 82 having a thickness of 0.3 t or more than, formed of the same material as the first auxiliary substrate 12, and having the same configuration as the first auxiliary substrate 12 is attached to a second substrate 81 formed of glass and having a thickness of 0.1 t-0.4 t, thereby completing a second process substrate 80.

Then, a general color filter process is performed on the second substrate 81 of the second process substrate 80, thereby forming black matrixes 253 at interfaces between the pixel regions. Then, a color filter layer 256 formed of red, green and blue color filter patterns sequentially repeated is formed to enclose the black matrixes 253. Then, a transparent conductive material is deposited on the color filter layer 256 thus to form a common electrode 258. Then, a column spacer 270 having a preset height is formed on the common electrode 258.

During such color filter process, the second process substrate 80 does not have severe bending owing to its bending degree similar to that of a general glass substrate having a thickness of about 0.7 t. This may prevent inferiority or damages of the second process substrate 80 during unit processing.

Figure 6D:
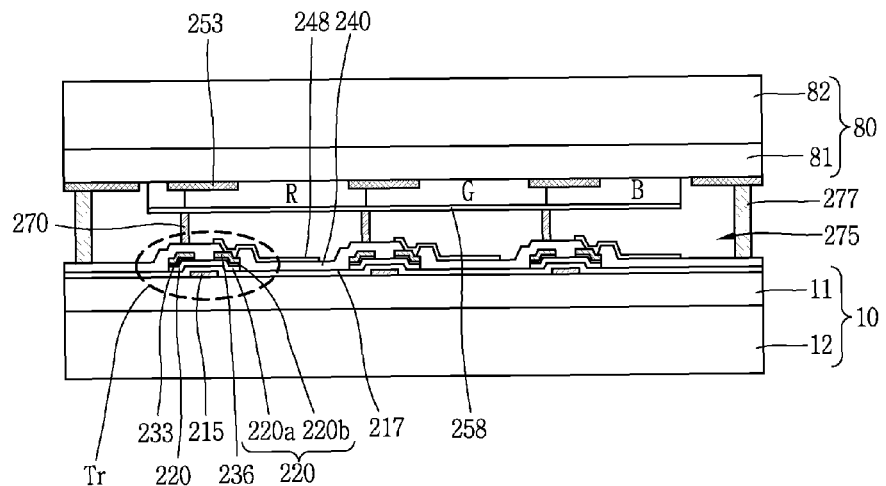

As shown in FIG. 6D, a seal pattern 277 is formed at an edge region of the first process substrate 10 or the second process substrate 80. Then, the first process substrate 10 having the pixel electrode 248 formed thereon is positioned to face the second process substrate 80 having the common electrode 258 formed thereon. In a state where an LC layer 275 is disposed at an inner side of the seal pattern 277, the end of the column spacer 270 is made to contact the passivation layer 240, the uppermost layer of the second process substrate 80. Then, the first process substrate 10 and the second process substrate 80 are attached to each other.

Figure 6E:
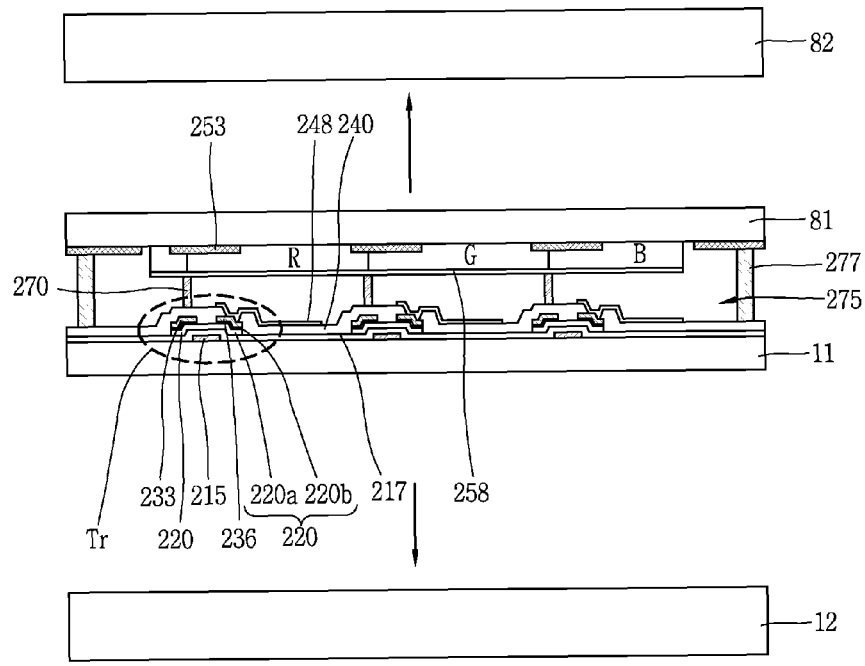

As shown in FIG. 6E, the first auxiliary substrate 12 and the second auxiliary substrate 82 are separated from the first process substrate 10 and the second process substrate 80 attached to each other, respectively, thereby completing an LC panel 200. Here, the first auxiliary substrate 12 and the second auxiliary substrate 82 separated from the LC panel 200 may be cleansed to be reused.

As aforementioned, even if both of the first substrate 11 having the array substrate and the second substrate 81 having the color filter layer have a thickness of 0.1 t-0.4 t, bending scarcely occurs since the LC panel 200 is implemented. Furthermore, even if bending occurs, the bending degree is smaller than that of a single glass substrate having a thickness of 0.1 t-0.4 t. When considering a bonding force, the bending degree is smaller than that of a single glass substrate having a thickness of 0.7 t. This may prevent problems resulting from bending during subsequent unit processing.

As aforementioned, in the LCD device of the present invention, the array substrate and the color filter substrate have a thickness of 0.1 t-0.4 t, respectively. Therefore, when compared to the conventional LCD device using a glass substrate having a thickness of 0.7 t, the entire thickness is reduced by 0.6 mm 1.2 mm, and the entire weight is reduced by 2/7-5/7. This can implement a light and thin LCD device, a desired display device according to a recent trend. Furthermore, in the method for fabricating an LCD device of the present invention, a process for etching an outer side surface of the LC panel is omitted. This can enhance productivity per unit time. Also, since the glass substrate having a thickness of 0.1 t-0.4 t is cheaper than a general glass substrate having a thickness of about 0.7 t, the entire fabrication costs can be reduced.

In the present invention, since the first substrate 11 and the second substrate 81 are attached to the first auxiliary substrate 12 and the second auxiliary substrate 82 by a vacuum attach device in a vacuum state, foreign materials or air foam are prevented from being introduced into space between the first substrate 11 and the first auxiliary substrate 12, and space between the second substrate 81 and the second auxiliary substrate 82. This may prevent inferiority of the substrates during subsequent TFT array process or color filter process. Furthermore, since the substrates are attached to each other by a uniform pressure, the occurrence of a wrap phenomenon may be prevented.

When applying the glass substrate having a thickness of 0.1 t-0.4 t smaller than a thickness (0.7 t) of a general glass substrate to a 3D LCD device, a distance between a black matrix and a film patterned retarder (FPR) which are formed on the color filter substrate for prevention of 3D crosstalk becomes short. This can improve a viewing angle for viewing a 3D display device, and implement enhanced brightness.

In the aforementioned description, the first substrate 11 and the second substrate 81 each implemented as a thin glass substrate are attached to the first auxiliary substrate 12 and the second auxiliary substrate 82. However, one of the first substrate 11 and the second substrate 81 may be attached to the auxiliary substrate. Preferably, the second substrate 81 having the color filter layer may be attached to the second auxiliary substrate 82, whereas the first substrate 11 having the thin film transistor may not undergo an attaching process with the first auxiliary substrate 12 while maintaining its original thickness. The reason is as follows. Since a viewing angle of a 3D display device is dependent on a distance between a black matrix and an FPR, only the second substrate 81 may be used as a thin glass substrate so as to enhance the viewing angle. In this case, the second substrate 81 is attached to the second auxiliary substrate 82.

In the aforementioned description, the vacuum attach device of a specific structure was used. However, the present invention is not limited to this. That is, the process substrate of the present invention may be fabricated not only by the specific vacuum attach device, but also by any vacuum attach device having a structure for attaching substrates to each other in a vacuum state.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for fabricating a liquid crystal display device, comprising:
providing a first substrate and a second substrate, the first and second substrates having respectively a first surface and a second surface;
attaching a third auxiliary substrate to the first surface of the second substrate;
contacting a second auxiliary substrate to the second surface of the second substrate in a vacuum state;
forming an atmospheric state at the out region of the contacted second substrate and second auxiliary substrate to press the contacted second substrate and second auxiliary substrate by the atmospheric pressure in order to attach the second substrate and the second auxiliary substrate;
separating the third auxiliary substrate from the first surface of the second substrate to form a second process substrate;
forming a gate line, a data line, a thin film transistor and a pixel electrode on the first surface of the first substrate;
forming a color filter layer on the first substrate of the second substrate of the second process substrate;
attaching the first surface of the first substrate and the first surface of the second process substrate to each other, thereby forming a liquid crystal panel; and
separating the second auxiliary substrate from the liquid crystal panel.

2. The process substrate of claim 1, wherein the first and second substrates have a roughness of 5.0 nm or less than.

3. The process substrate of claim 1, wherein the first auxiliary substrate has a thickness of 0.3 mm~1.0 mm.

4. The method of claim 1, further comprising forming a first process substrate by attaching the first substrate to a first auxiliary substrate,
wherein a gate line, a data line, a thin film transistor and a pixel electrode are formed on the first substrate of the first process substrate.

5. The method of claim 4, wherein the step of forming a first process substrate includes:
contacting the first substrate and the first auxiliary substrate with each other in a vacuum state; and
forming an atmospheric state at the outside of the contacted first substrate and first auxiliary substrate to press the contacted first substrate and first auxiliary substrate by the atmospheric pressure in order to attach the first substrate and the first auxiliary substrate.

6. The method of claim 4, wherein the step of forming a first process substrate includes:
attaching a fourth auxiliary substrate to a first surface of the first substrate;
contacting a second surface of the first substrate with one surface of the first auxiliary substrate in a vacuum state;
forming an atmospheric state at the outside of the first substrate contacted with the first auxiliary substrate and the fourth auxiliary substrate to press the contacted first substrate, first auxiliary substrate, and fourth auxiliary substrate by the atmospheric pressure in order to attach the first auxiliary substrate and the fourth auxiliary substrate to the first substrate; and
separating the fourth auxiliary substrate from the first substrate.

7. The method of claim 1 or 4, further comprising aligning the first substrate and the first auxiliary substrate with each other, and aligning the second substrate and the second auxiliary substrate with each other.

8. The method of claim 7, wherein aligning includes:
aligning corner of the first substrate and the first auxiliary substrate; and
aligning corner of the second substrate and the second auxiliary substrate.

9. The method of claim 7, wherein aligning includes;
aligning four edges of the first substrate are aligned with four edges of the first auxiliary substrate; and
aligning four edges of the second substrate are aligned with four edges of the second auxiliary substrate.

10. The process substrate of claim 1, wherein the second and third auxiliary substrates have a thickness of 0.3 mm or more than.

11. The process substrate of claim 10, wherein the second and third auxiliary substrates have a thickness of 0.3 mm~1.0 mm.

12. The process substrate of claim 11, wherein the first and second substrates have a thickness of 0.1 mm~0.4 mm.

* * * * *